United States Patent [19]
Fulton

[11] 4,042,835
[45] Aug. 16, 1977

[54] CHARGE COUPLED DEVICE
[75] Inventor: James T. Fulton, Stamford, Conn.
[73] Assignee: Grumman Aerospace Corporation, Bethpage, N.Y.
[21] Appl. No.: 660,822
[22] Filed: Feb. 24, 1976
[51] Int. Cl.² .............................................. H03K 5/15
[52] U.S. Cl. .............................. 307/221 D; 307/269; 357/24
[58] Field of Search ............. 307/221 D, 221 C, 238, 307/303, 269; 357/24; 340/173 CA; 445/1

[56] References Cited
U.S. PATENT DOCUMENTS

| | | | |
|---|---|---|---|
| 3,919,468 | 11/1975 | Weimer | 307/221 D |
| 3,931,463 | 1/1976 | Levine | 357/24 |
| 3,958,210 | 5/1976 | Levine | 357/24 |

OTHER PUBLICATIONS
IEEE Journal of Solid State Circuits, vol. Sc-9, No. 1, Feb. 1974, pp. 1-13, White et al, "Characterization of Surface Channel CCD Image Arrays at Low Light Levels.

Primary Examiner—John Zazworsky
Assistant Examiner—Marcus S. Rasco
Attorney, Agent, or Firm—Richard G. Geib; Mellor A. Gill

[57] ABSTRACT

A very low noise input charge coupled device employing switches to provide a voltage gain in all electrodes prior to or in conjunction with the transfer of the signal(s) into, for example, a shift register so as to insure a signal amplitude well above the noise level associated with the shift register of the charge coupled device.

1 Claim, 4 Drawing Figures

U.S. Patent    Aug. 16, 1977    4,042,835
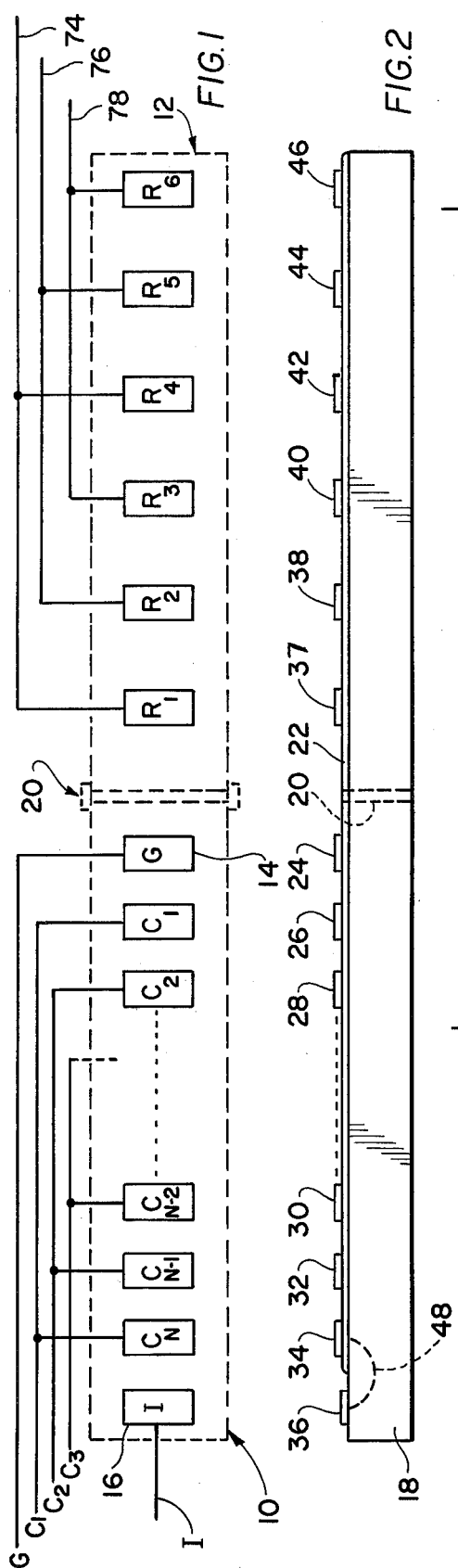
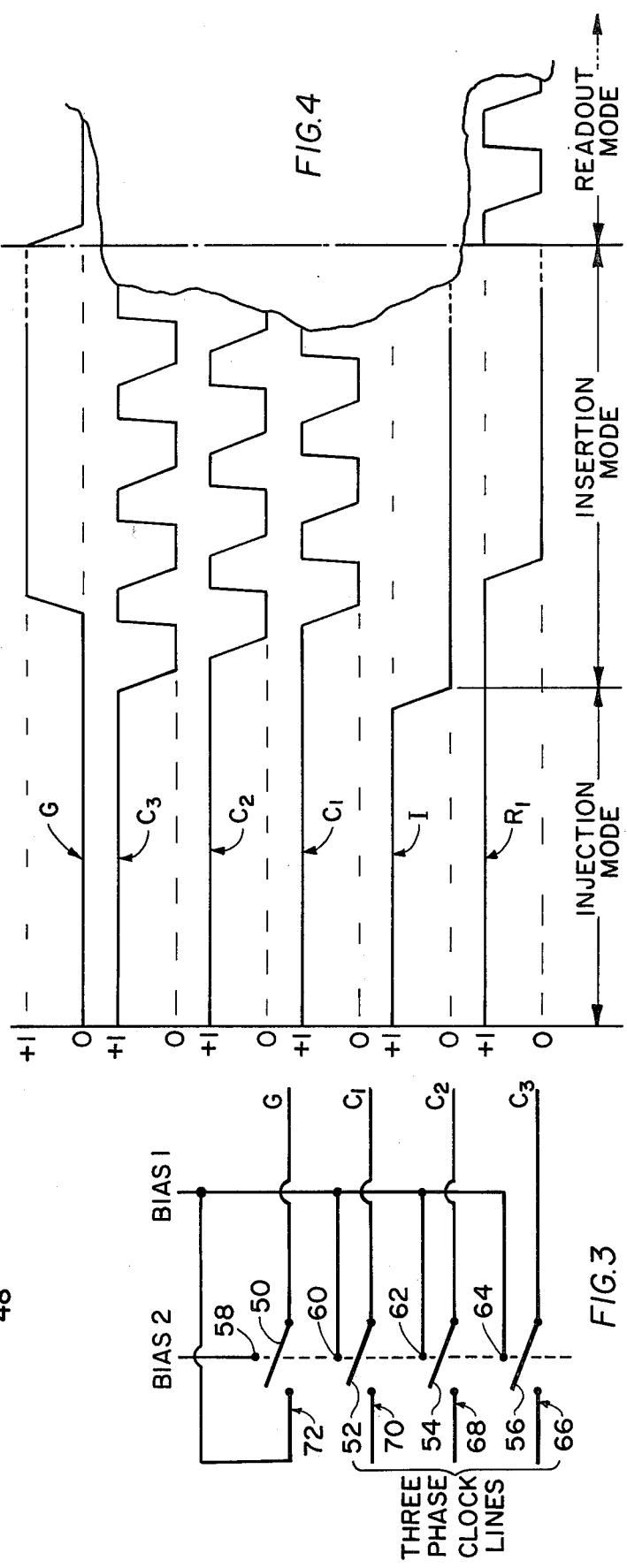

4,042,835

CHARGE COUPLED DEVICE

FIELD OF INVENTION

This invention relates to large scale integrated circuits (LSI's) of the charge coupled device (CCD) subclass having improved low noise signal handling performance.

BACKGROUND

Reference may be had to the April 1970 Bell System Technical Journal articles on Page 587 entitled "Charge Coupled Semiconductor Devices" by W. S. Boyle and G. E. Smith for a background description of the device. Essentially at the risk of starting again what others have said over and over, a charge coupled device consists of a metal insulator semiconductor structure in which minority carriers are stored in a well, which can be termed a boat filled with electrons at the surface of the semiconductor, so that the charge may be moved along the surface by moving the potential minimum.

Other prior art references in the area of concern of this invention were noted in chronological order of disclosure to be:

A. CHARGE COUPLED DEVICE SHIFT REGISTER READ/WRITE/REGENERATION CIRCUIT, L. M. Terman, IBM Technical Disclosure Bulletin, 14 No. 12:3784-3785, May 1972;

B. U. S. Pat. Nos. 3,806,772-3, 852,801 and 3,867,645; and

C. Published patent application B 309,755 of Jan. 28, 1975, now U.S. Pat. No. 3,919,468.

In this prior art a typical low noise input structure has a capacitance of the well located under the input electrode to be typically 1.0 Picofarad as are the capacitances under the successive adjacent array elements. These devices can only store a small charge at the operating voltages of conventional integrated circuits (IC's.) This small charge exhibits quantum variations (noise) of such a magnitude that only voltages greater than tens of millivolts can be applied to the input if the output signal-to-noise ratio greater than one is desired, even for audio band widths.

It has been found that attempts to alleviate the above by scaling up the size of the input electrodes, and thereby the electrode capacitances to allow acceptances of microvolt signals requires too much physical space on the substrate surface to be practical: The factor is at least 10 to 1. Furthermore, the voltage fields associated with such large capacitors would not collapse properly when the switching voltages were changed in order to shift the signal.

This invention differs from the prior art significantly in providing a structure whereby data entry is via increasing area and capacitance of an input electrode to increase the potential accumulating of a charge. This is structurally possible by this invention's disclosure to the art of switch means electrically connecting together several adjacent clocking electrodes during data entry and then with the teachings of this invention using a portion of the switch means to cause the clocking electrodes to regain their identity during a data load phase whereby they sequentially sweep successive portions of the accummulated charge towards a gate which is then operated to sweep the charge into, for example, a shift register.

Another object of this invention is to, therefore, disclose how one can in such a device achieve a capacitance about one-tenth that under the previously clocked input electrode whereby a proportional voltage gain results to give a signal-to-noise advantage as the data is shifted through the device.

A more detailed object with which reference was made above is to provide a very low noise input capability for a charge coupled device and simultaneously provide a voltage gain in each electrode of the device prior to or in conjunction with the transfer of the signal(s) into the shift register to provide a signal gain that insures the amplitude of the signal will be well above the noise level associated with the shift register of the charge coupled device.

A more specific object of this invention is the use of switches to increase the area of the well associated with an input electrode and thereafter subdivide the input into discrete electrodes consisting of one or more sets of clocking electrodes that will sweep the charge along from under one electrode to the next whereby a well capacitance of 10.0 Picofarads will in proportion to that under the electrodes of 1.0 Picofarad provide a voltage increase of 10 without serious degradation by extraneous noise associated with a multiplexing process such as described.

Other object and advantages will appear from the drawings and their description that follows.

DRAWING DESCRIPTION

FIG. 1 is a schematic representation of a charge couple device shift register in accordance with this invention;

FIG. 2 is a side view of the structure of FIG. 1:

FIG. 3 is a schematic illustration of means to increase the well and clock the electrodes in accordance with this invention; and FIG. 4 is a graphical illustration of an operation sequence of the device.

DETAILED DESCRIPTION

With more particular reference to FIG. 1 there is shown thereby an array 10 of $n$ charge coupled regions $C_N$, $C_{N-1}$, $C_{N-2}$-$C_3$, $C_2$, $C_1$ coupled to a charge coupled output register 12 including electrodes $R_1$ through $R_6$ by means of a gate electrode 14. As seen an input electrode 16 is also provided for array 10.

In FIG. 2 there is shown one form of this invention where the aforesaid structure is shown to be comprised of a uniformly doped P-type silicon substrate 18 having a portion 20 therebetween to isolate the clocking side 10 from the register 12. To such an oxide layer 22 such as silicon dioxide (Si $O_2$) is formed. This layer 22 insulates gate 24 and conducting electrodes 26, 28, 30 32, and 34 as well as input 36 and electrodes 34, 38, 40, 42, 44, and 46 of the register from the substrate. completing the structure a junction 48 is formed by appropriate doping to provide an area of N-type material so as to be the source of minority carriers for collection in a well and transfer as will be discussed in greater detail hereinafter.

With reference to FIG. 3 there is shown the heart of this invention whereby switches 50, 52, 54, and 56 are shown to be linked as as to move in unison between switch contacts, as by relay means well known in the art of switch control, and when on to contacts 58, 60 62, and 64 provide a common voltage to all electrodes 26, 28, 30, 32, 34 etc. to insert a charge in a well thereunder and hold same with a high (Bias 2) on gate 24. Thereafter the switches 56, 54, and 52 are clocked on poles 66, 68, and 70 to transfer the charge to the gate 24 which, when switch 50 is moved to pole 72, will connect gate 24 to a low source such as Bias 1 to allow passage of the charge to register electrode $R_1$ (37) following which, as will be familiar to those skilled in the art, will, on start of the register clock via lines 74, 76, and 78, transfer the charge to electrodes 38, then 40, then 42, then 44, and then 46.

This invention is equally applicable to an N substrate. With an N substrate the device is operable with BIAS 1 in a high state and BIAS 2 being low. More particularly, the input charge will be inserted under the electrodes, as before, and held while switch 50 is connecting BIAS 2 to the gate G. In such a mode G is low and blocks charge transfer. Not unitl switch 50 connects the gate to the normally high BIAS 1, as by closing on pole 72 does the charge transfer to $R_1$.

This is graphically illustrated by FIG. 4 wherein it is shown that whenever a charge is being injected I is high, G is low and $C_3$, $C_2$, $C_1$, etc. are high as is the waveform surface potential $R_1$ of the first register element. Upon return to discrete electrode operation of $C_3$, $C_2$, $C_1$, Etc. in a clocking operation the surface potential for the gate electrode G goes high to switch $R_1$ to low until such time as the sweep via the clocking electrodes is adjacent the gate G whereupon dropping G to low passes the pulse read-out waveform for $R_1$.

Having described an operative construction for this invention it is now described to set forth in the intended protection of these Letters Patent by the appended claims.

I claim:

1. A charge coupled semiconductor device comprising:

sources of high and low potentials and three phase clock signals:

a semiconductor substrate;

a layer of insulating material disposed on a first surface of said semiconductor substrate;

a plurality of electrodes disposed on the surface of said layer of insulating material;

a gate electrode disposed on the surface of said layer of insulating material after said plurality of electrodes;

a circuit connected to said plurality of electrodes and said gate electrode including, a first switch means for connecting together the plurality of electrodes, said first switch means having switch arms operable between contacts connected to one of the sources of high and low potentials and poles connected to the three phase clock signals such that in one position of said switch arms on the contacts a common charge is applied and in another position of the switch arms on the poles the three phase clock signals operate the plurality of electrodes to sequentially control signals to the plurality of electrodes in progession from one of the plurality of electrodes to another toward the gate electrode and a second switch means having a switch arm operable between a contact connected with the other source of high and low potentials and a pole connected with said one source of high and low potentials said switch arm of said second switch means being operatively linked to the first switch means switch arms to provide said other source at the gate electrode during the time said first switch means switch arms are in said one position connecting the said one source of high and low potentials to the plurality of electrodes to block transfer via said gate electrode and in said another position with said first switch means switch arms to permit transfer via said gate electrode when the switch arm of said second switch means and said first switch means switch arms are on said poles thereby connecting said one source to the gate to open same and placing the plurality of electrodes under control of the three-phase clocking signals.

* * * * *